(12) United States Patent
Kung et al.

(10) Patent No.: US 10,605,828 B2
(45) Date of Patent: Mar. 31, 2020

(54) DEVICE FOR ATTACHING A SEMICONDUCTOR DEVICE TO A CIRCUIT BOARD

(71) Applicant: Advanced Semiconductor Engineering, Inc., Kaohsiung (TW)

(72) Inventors: Heng Yu Kung, Kaohsiung (TW); Shu-Hsien Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 241 days.

(21) Appl. No.: 15/474,394

(22) Filed: Mar. 30, 2017

(65) Prior Publication Data

US 2018/0284152 A1   Oct. 4, 2018

(51) Int. Cl.
| | |
|---|---|
| *B23P 19/00* | (2006.01) |
| *G01R 1/04* | (2006.01) |
| *H01L 23/32* | (2006.01) |
| *H05K 1/18* | (2006.01) |
| *G01R 31/28* | (2006.01) |
| *H05K 3/32* | (2006.01) |

(52) U.S. Cl.
CPC ............ *G01R 1/0408* (2013.01); *G01R 1/04* (2013.01); *G01R 31/2865* (2013.01); *H01L 23/32* (2013.01); *H05K 1/181* (2013.01); *H05K 3/325* (2013.01); *G01R 1/0433* (2013.01); *G01R 31/2808* (2013.01); *G01R 31/2849* (2013.01); *G01R 31/2874* (2013.01); *H05K 2201/10393* (2013.01); *H05K 2201/10409* (2013.01); *H05K 2201/10424* (2013.01); *Y10T 29/53174* (2015.01)

(58) Field of Classification Search
CPC .......... H01L 23/32; H05K 2201/10393; H05K 2201/10598; H05K 3/341; Y10T 29/53174; Y10T 29/5313; Y10T 29/49764; Y10T 24/44017; Y10T 29/4913
USPC ......... 29/739, 225, 593, 705, 718, 740, 754, 29/829, 832
See application file for complete search history.

(56) References Cited

U.S. PATENT DOCUMENTS

| | | | | |
|---|---|---|---|---|
| 5,784,257 | A * | 7/1998 | Tata ..................... | H01L 23/4006 165/185 |
| 6,029,330 | A | 2/2000 | Ratia, Jr. | |
| 6,958,913 | B2 * | 10/2005 | Koo ..................... | H01L 23/4006 165/185 |
| 7,460,372 | B2 * | 12/2008 | Liao ..................... | H01L 23/4006 165/80.3 |
| 7,679,919 | B2 * | 3/2010 | Lee ..................... | H01L 23/4093 165/185 |
| 2005/0162152 | A1 | 7/2005 | Yates | |

* cited by examiner

*Primary Examiner* — Thiem D Phan
(74) *Attorney, Agent, or Firm* — Foley & Lardner LLP

(57) ABSTRACT

A device used for attaching a semiconductor device to a circuit board over a first temperature. The device includes a hook member that includes a first hook, a second hook, and a body between the first hook and the second hook. The body has a first surface, a second surface opposite the first surface, and a first hole extended from the first surface to the second surface. The device further includes a fixing member and a holder. The fixing member has a second hole, and the holder passes through the first hole and the second hole, and is engaged with the fixing member.

21 Claims, 11 Drawing Sheets

DEVICE FOR ATTACHING A SEMICONDUCTOR DEVICE TO A CIRCUIT BOARD

TECHNICAL FIELD

The present disclosure generally relates to a device for semiconductor testing, and more particularly relates to a device for attaching a semiconductor device to a circuit board.

BACKGROUND

Semiconductor devices, circuits, or dies are commonly tested before mass production. In general, a semiconductor device is mounted on a circuit board before it can be tested. In order to mount a semiconductor device on a circuit board, a stencil fabrication process and a surface-mount technology (SMT) can be used. Stencil fabrication is a process of depositing solder paste on printed circuit boards (PCBs) to establish electrical connections. SMT is a method used for producing electronic circuits in which electronic components are mounted or placed directly onto surfaces of PCBs. Each of the stencil fabrication and SMT processes typically takes weeks to complete, and thus prolongs the overall time required before the test procedures for a semiconductor device can start.

SUMMARY

In some embodiments, according to one aspect, a device is disclosed for attaching a semiconductor device to a circuit board over a first temperature. The device includes a hook member that includes a first hook, a second hook and a body between the first hook and the second hook. The body has a first surface, a second surface opposite the first surface, and a first hole extended from the first surface to the second surface. The device further includes a fixing member and a holder. The fixing member has a second hole, and the holder passes through the first hole and the second hole and engages with the fixing member.

In some embodiments, according to another aspect, a device for attaching a semiconductor device to a circuit board over a first temperature is disclosed. The device includes a first hook member that includes a first body, and a first hook connected to the first body. The first body has a first surface, a second surface opposite the first surface, and a first hole extended from the first surface to the second surface. The device further includes a second hook member that includes a second body and a second hook connected to the second body. The second body has a first surface, a second surface opposite the first surface, and a second hole extending from the first surface to the second surface. The device further includes a fixing member having a third hole, and a holder engaged with the fixing member.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
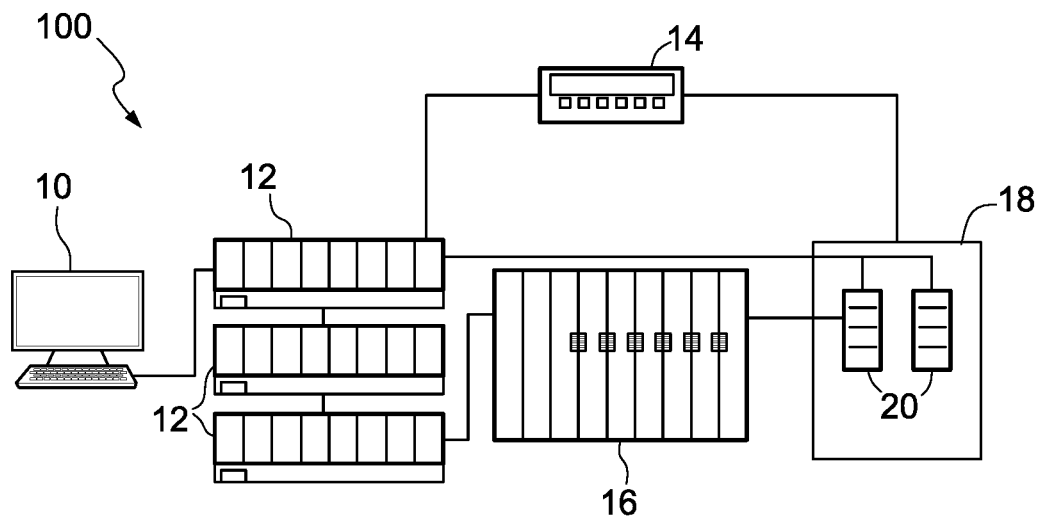
FIG. 1 is a schematic diagram illustrating a test system for electro-migration testing in accordance with some embodiments of the present disclosure.

Manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

In accordance with at least some embodiments, it is an object of the present disclosure to provide a device for attaching one or more semiconductor devices to a circuit board. Utilization of the device eliminates both the stencil fabrication process and the SMT process, and thus shortens the overall preparation time before the test procedures for a semiconductor device can start.

During electro-migration testing procedures and thermal cycle testing procedures, semiconductor devices are placed into an oven that maintains a temperature of greater than or equal to 165° C. (degree Celsius). However, conventional test sockets available on the market are not designed for sustaining a test environment having such a high temperature. In accordance with at least some embodiments, it is an object of the present disclosure to provide a device for attaching a semiconductor device to a circuit board that can sustain an environmental temperature of at least about 120° C., at least about 165° C., at least about 200° C., or at least about 250° C.

FIG. 1 is a schematic diagram illustrating a test system 100 for electro-migration testing in accordance with some embodiments of the present disclosure. The test system 100 includes a computer 10, a plurality of power suppliers 12, a data access acquire system (DAS) 14, multiple DAS modules 16 and an oven 18. One or more semiconductor devices under testing will be disposed on one or more test vehicles 20 within the oven 18. The computer 10 is configured to control the power suppliers 12 to provide a stable and consistent test current to the test vehicle 20. The DAS 14 is configured to acquire measures of voltages and currents from a semiconductor device under testing on the test vehicle 20. The multiple DAS modules 16 substantially have the same functions as the DAS 14, but also can simultaneously acquire measures of voltages and currents from multiple semiconductor devices under testing. Based on the measures of the voltages and the currents, the computer 10 estimates the lifetime of the semiconductor devices under testing by observing whether the resistances of the semiconductor devices under testing exceed a predetermined threshold level.

In some embodiments, the test system 100 can also be used in a thermal cycle test. Thermal cycle test is a process of cycling through two temperature extremes, typically at relatively high rates of change. Thermal cycle test may be an environmental stress test used in evaluating product reliability as well as in manufacturing to catch early-term, latent defects by inducing failure through thermal fatigue.

In both the electro-migration test and the thermal cycle test, the temperature of the semiconductor device under testing is under control. In some embodiments, the oven 18 may provide an adjustable temperature for the semiconductor device under testing during the electro-migration test or the thermal cycle test.

Figure 2:
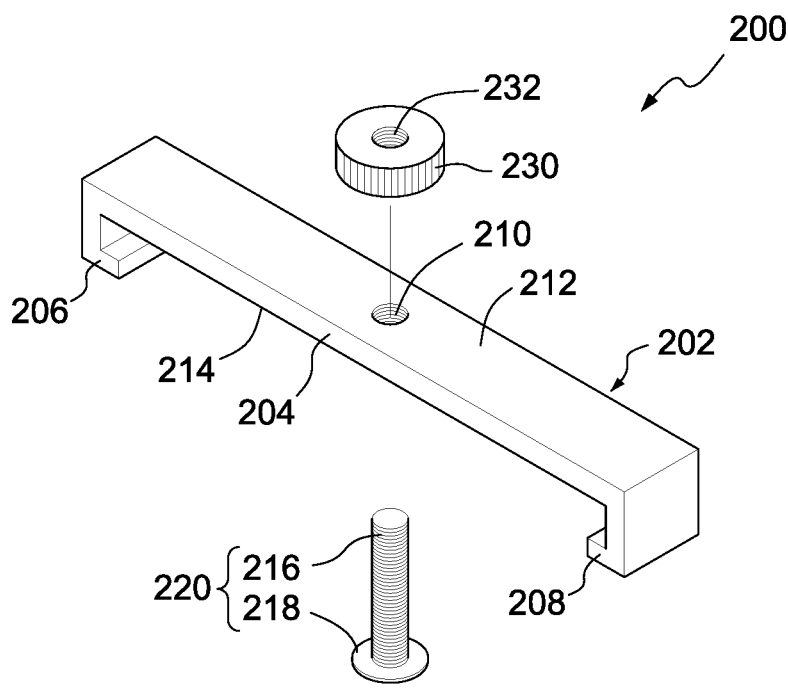
FIG. 2 is a schematic diagram illustrating an exploded view of a device for attaching a semiconductor device to a circuit board in accordance with some embodiments of the present disclosure.

In some embodiments, during testing of a semiconductor device, the semiconductor may be attached to a circuit board using a device, without a stencil fabrication process or an SMT process. FIG. 2 is a schematic diagram illustrating an exploded view of a device 200 for attaching a semiconductor device to a circuit board in accordance with some embodiments of the present disclosure. The device includes a hook member 202, a fixing member 230 and a holder 220. The hook member 202 includes a first hook 206 and a second hook 208. The first hook 206 and the second hook 208 are connected by a body 204. The body 204 includes a first surface 212 and a second surface 214 that is opposite to the first surface 212. A first hole 210 is disposed on the body 204 and extends from the first surface 212 to the second surface 214.

In some embodiments, the fixing member 230 may be in a form of a nut. A second hole 232 may be disposed in the center of the fixing member 230. The outer surface of the fixing member 230 may include knurling, such that the fixing member 230 can be easily twisted by hand or by specific tools such as a torque wrench.

In some embodiments, the holder 220 may include a bolt section 216 and an abutting section 218. The bolt section 216 is configured to pass through the first hole 210 and engage with the fixing member 230 through the second hole 232. The surface of the bolt section 216, the inner surfaces of the first hole 210 and the second hole 232 may include threads. Therefore, the position of the abutting section 218 can be gradually adjusted by rotating the fixing member 230. In some embodiments, the abutting section 218 may be configured to contact an upper surface of a semiconductor device under testing and apply a pressure to the semiconductor device.

In some embodiments, the hook member 202, the fixing member 230 and the holder 220 can be formed of, or include, materials having a melting point of at least about 120° C., at least about 165° C., at least about 200° C., or at least about 250° C. Therefore, the device 200 is capable of attaching a semiconductor device to a circuit board in the oven 18 under a temperature of at least about 120° C., at least about 165° C., at least about 200° C., or at least about 250° C.

Figure 3A:
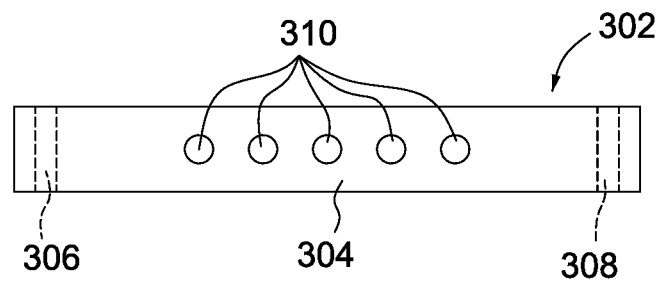
FIG. 3A is a schematic diagram illustrating a top view of a hook member in accordance with some embodiments of the present disclosure.

In some embodiments, a hook member may include more than one hole. FIG. 3A is a schematic diagram illustrating a top view of a hook member 302 in accordance with some embodiments of the present disclosure. As shown in FIG. 3A, the hook member 302 includes five holes 310. The holder 220 may pass through any one of the holes 310 depending on the position suitable for contacting a semiconductor device under testing. The number of the holes and the positions of the holes can vary or be adjusted or modified.

Figure 3B:
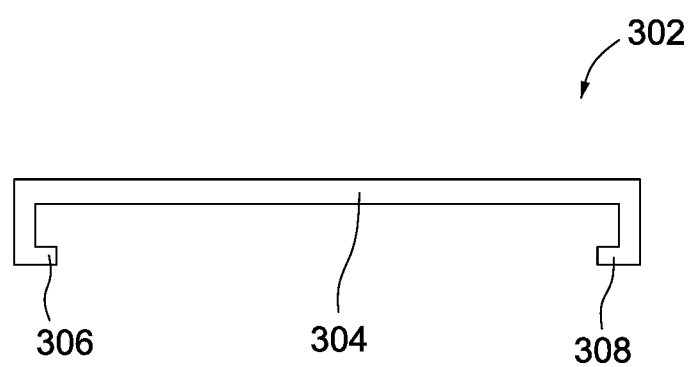
FIG. 3B is a schematic diagram illustrating a side view of a hook member in accordance with some embodiments of the present disclosure.

FIG. 3B is a schematic diagram illustrating a side view of the hook member 302 in accordance with some embodiments of the present disclosure. A first hook 306 and a second hook 308 are connected by a body 304. The first hook 306 and the second hook 308 are configured to hook on opposite sides (or edges) of a circuit board. The specification and dimension of components of the hook member can vary. For example, the thickness of the body 304 and the lengths of the first hook 306 and the second hook 308 can be adjusted or modified depending on the materials used for forming the hook member 302. The holes 310 disposed on the hook members 310 have a diameter for a holder to pass through the holes.

Figure 4:
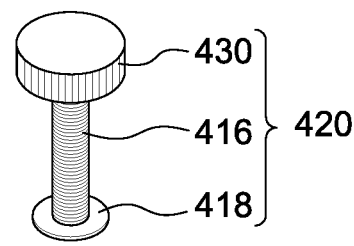
FIG. 4 is a schematic diagram illustrating a holder in accordance with some embodiments of the present disclosure.

FIG. 4 is a schematic diagram illustrating a holder 420 in accordance with some embodiments of the present disclosure. The holder 420 includes a nut 430, a bolt section 416 and an abutting section 418. The nut 430 is fixed to a first end of the bolt section 416 and the abutting section 418 is fixed to a second end of the bolt section 416. When the nut 430 is rotated, the bolt section 416 and the abutting section 418 will be simultaneously rotated. In some embodiments, the outer surface of the nut 430 may include knurling, such that the nut 430 can be easily twisted by hand or by specific tools such as a torque wrench.

Figure 5A:
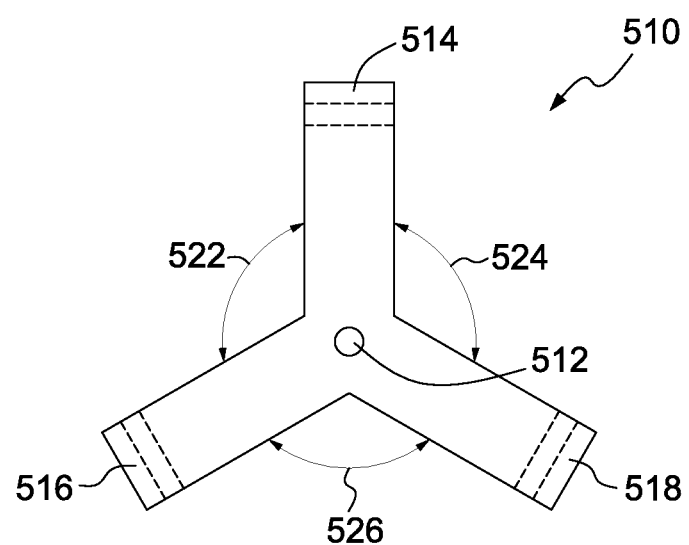
FIG. 5A is a schematic diagram illustrating a top view of a hook member in accordance with some embodiments of the present disclosure.
Figure 5B:
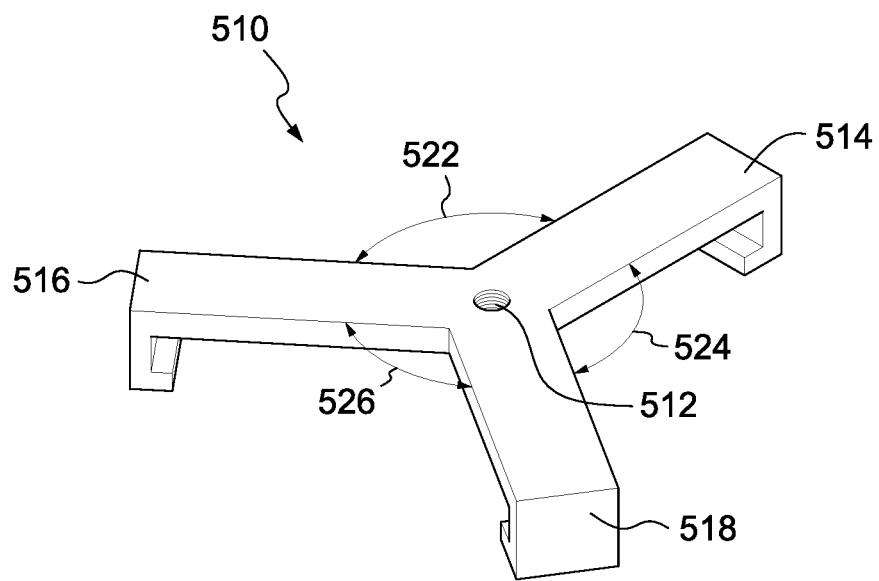
FIG. 5B is a schematic diagram illustrating a perspective view of a hook member in accordance with some embodiments of the present disclosure.

In some embodiments, a hook member may include more than two hooks. FIGS. 5A and 5B are schematic diagrams respectively illustrating a top view and a perspective (three-dimensional) view of a hook member 510 in accordance with some embodiments of the present disclosure. As shown in FIG. 5A, hook member 510 includes a first hook 514, a second hook 516 and a third hook 518. A hole 512 is disposed on the hook members 510 for a holder to pass through.

A first angle 522 is defined as between the first hook 514 and the second hook 516, a second angle 524 is defined as between the first hook 514 and the third hook 518, and a third angle 526 is defined as between the second hook 516 and the third hook 518. In some embodiments, the first angle 522, the second angle 524 and the third angle 526 may have substantially the same angle degree. In some embodiments, the first angle 522, the second angle 524 and the third angle 526 may be different and can be individually adjusted according to the shape of the circuit board to which a semiconductor device is attached.

Although the first hook 514, the second hook 516 and the third hook 518 shown in FIGS. 5A and 5B have substantially the same length, the lengths of the first hook 514, the second hook 516 and the third hook 518 may be different and can be individually adjusted according to the shape of the circuit board to which a semiconductor device is attached.

Figure 5C:
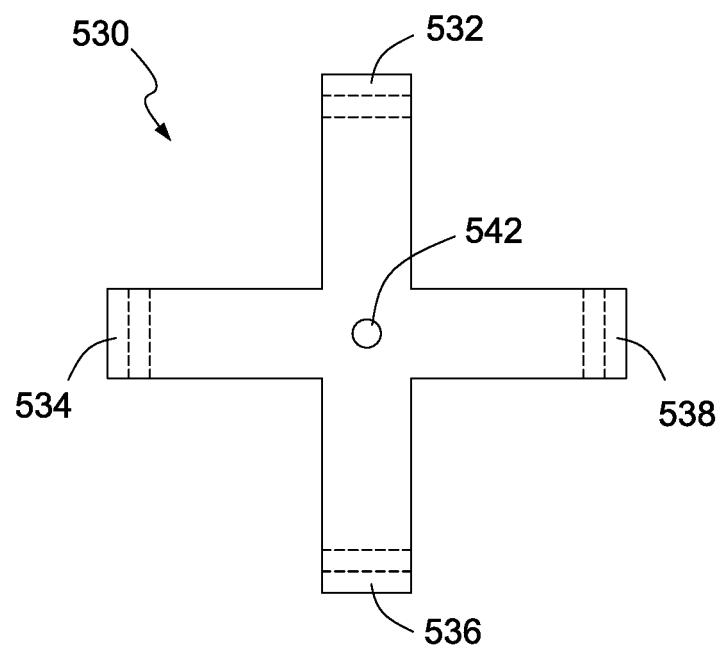
FIG. 5C is a schematic diagram illustrating a top view of a hook member in accordance with some embodiments of the present disclosure.
Figure 5D:
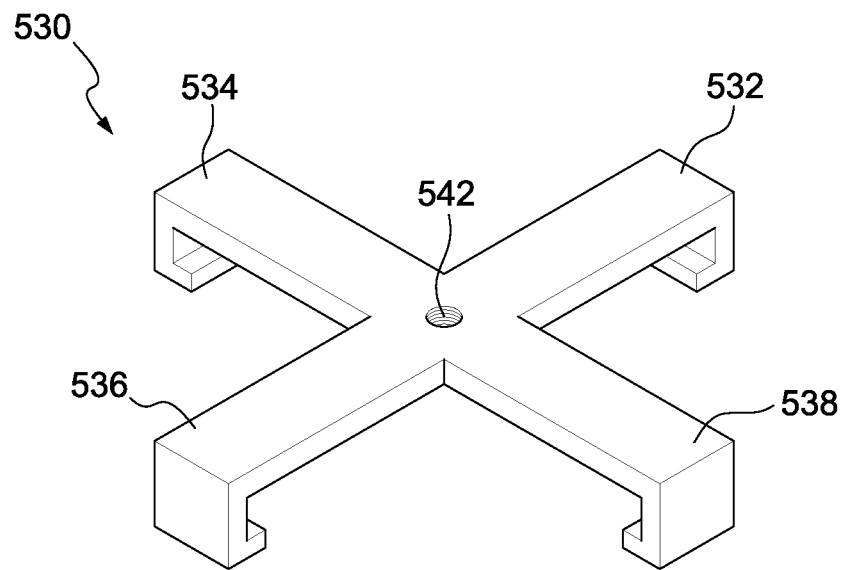
FIG. 5D is a schematic diagram illustrating a perspective view of a hook member in accordance with some embodiments of the present disclosure.

FIGS. 5C and 5D are schematic diagrams respectively illustrating a top view and a perspective (three-dimensional) view of a hook member 530 in accordance with some embodiments of the present disclosure. The hook member 530 includes a first hook 532, a second hook 534, a third hook 536, and a fourth hook 538. A hole 542 is disposed on the hook members 530 for a holder to pass through.

Although the first hook 532, the second hook 534, the third hook 536, and the fourth hook 538 shown in FIGS. 5C and 5D have substantially the same length, the lengths of the first hook 532, the second hook 534, the third hook 536 and the fourth hook 538 may be the same or different and may be individually adjusted according to the shape of the circuit board to which a semiconductor device is attached. The angles between the hooks may be the same or may be different and may be individually adjusted according to the shape of the circuit board to which a semiconductor device is attached.

Figure 6A:
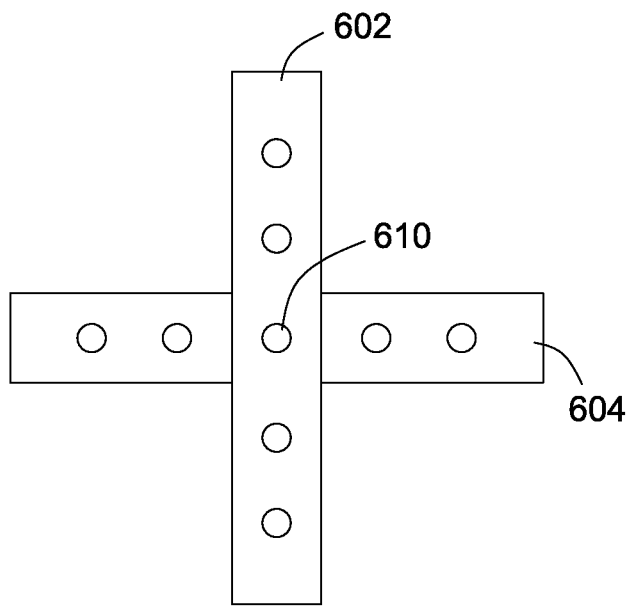
FIG. 6A is a schematic diagram illustrating a top view of a combination of hook members in accordance with some embodiments of the present disclosure.

In some embodiments, a device for attaching a semiconductor device to a circuit board may include a combination of multiple hook members. FIG. 6A is a schematic diagram illustrating a top view of a combination of hook members in accordance with some embodiments of the present disclosure. In some embodiments, a hook member 602 or a hook member 604 has substantially the same structure as the hook member 302 as shown in FIGS. 3A and 3B. As shown in FIG. 6A, the hook member 602 is stacked above the hook member 604. A plurality of holes are disposed on the body of each of the hook members 602 and 604.

As the hook member 602 is stacked above the hook member 604, one hole of the hook member 602 and one hole of the hook member 604 are aligned for a holder to pass through. In FIG. 6A, the center hole 610 of the hook member 602 is aligned with the center hole of the hook member 604. However, different holes of the hook members 602 and 604 may be aligned depending on the position suitable for connecting a semiconductor device to a circuit board under testing.

Figure 6B:
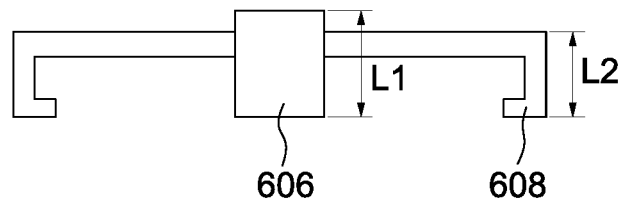
FIG. 6B is a schematic diagram illustrating a side view of a combination of hook members in accordance with some embodiments of the present disclosure.
Figure 6C:
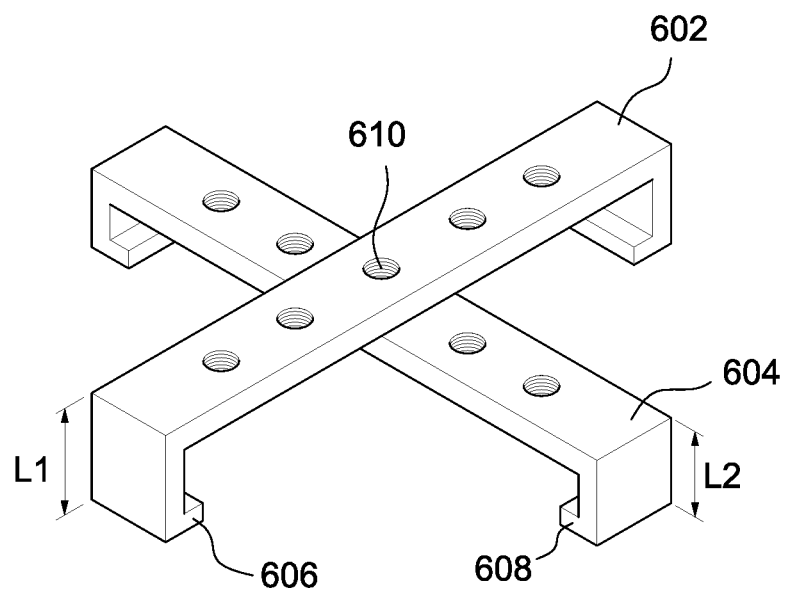
FIG. 6C is a schematic diagram illustrating a perspective view of a combination of hook members in accordance with some embodiments of the present disclosure.

FIG. 6B is a schematic diagram illustrating a side view of a combination of hook members in accordance with some embodiments of the present disclosure. FIG. 6C is a schematic diagram illustrating a perspective (three-dimensional) view of a combination of hook members in accordance with some embodiments of the present disclosure. As shown in FIG. 6B, the length L1 of the hook 606 of the hook member 602 may be greater than the length L2 of the hook 608 of the hook member 604. Alternatively, in some embodiments, if the hook members 602 and 604 are made of flexible materials such that the body of the hook member 602 and the hook member 604 can be bent, then the length L1 and the length L2 may be substantially the same or the length L2 may be greater than the length L1.

Figure 7A:
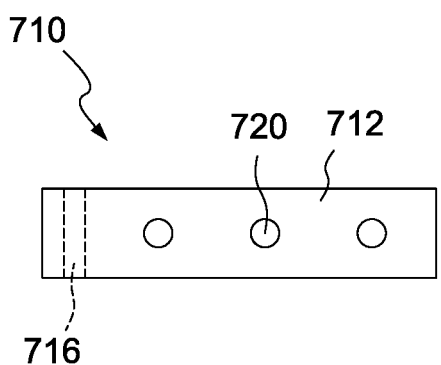
FIG. 7A is a schematic diagram illustrating a top view of a hook member in accordance with some embodiments of the present disclosure.
Figure 7B:
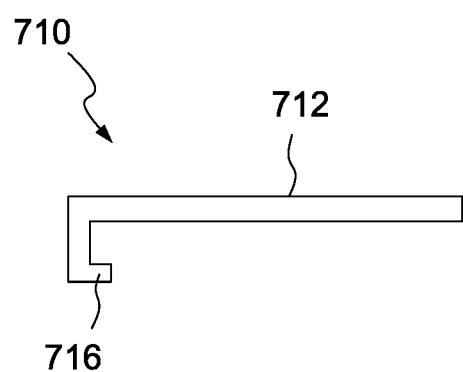
FIG. 7B is a schematic diagram illustrating a side view of a hook member in accordance with some embodiments of the present disclosure.

In some embodiments, a hook member may include a single hook. FIG. 7A is a schematic diagram illustrating a top view of a hook member 710 in accordance with some embodiments of the present disclosure. As shown in FIG. 7A, hook member 710 has one hook 716 on one edge of the hook member 710. A plurality of holes 720 are disposed on the body 712 of the hook member 710. FIG. 7B is a schematic diagram illustrating a side view of the hook member 710 in accordance with some embodiments of the present disclosure.

Figure 7C:
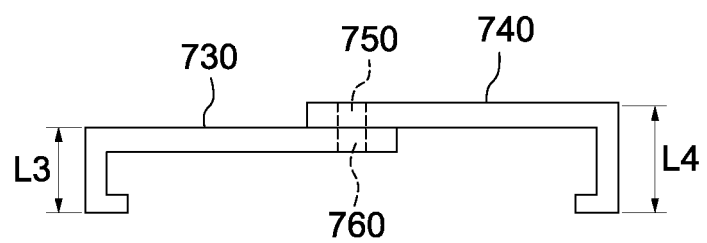
FIG. 7C is a schematic diagram illustrating a side view of a combination of hook members in accordance with some embodiments of the present disclosure.

In some embodiments, a device for attaching a semiconductor device to a circuit board may include a combination of multiple hook members, each of which includes a single hook. FIG. 7C is a schematic diagram illustrating a side view of a combination of hook members in accordance with some embodiments of the present disclosure. As shown in FIG. 7C, a hook member 740 is stacked over a hook member 730. In some embodiments, the hook members 730 and 740 may have substantially the same structure as the hook member 710. In some alternative embodiments, hook members 730 and 740 may have structures that are different from each other. One hole 760 of the hook member 730 and one hole 750 of the hook member 740 are aligned for a holder to pass through.

As shown in FIG. 7C, the length L4 of the hook of the hook member 740 may be greater than the length L3 of the hook of the hook member 730. Alternatively, in some embodiments, if the hook members 730 and 740 are made of flexible materials such that the body of the hook member 730 and the hook member 740 can be bent, then the length L3 and the length L4 may be substantially the same or the length L3 may be greater than the length L4.

Figure 8:
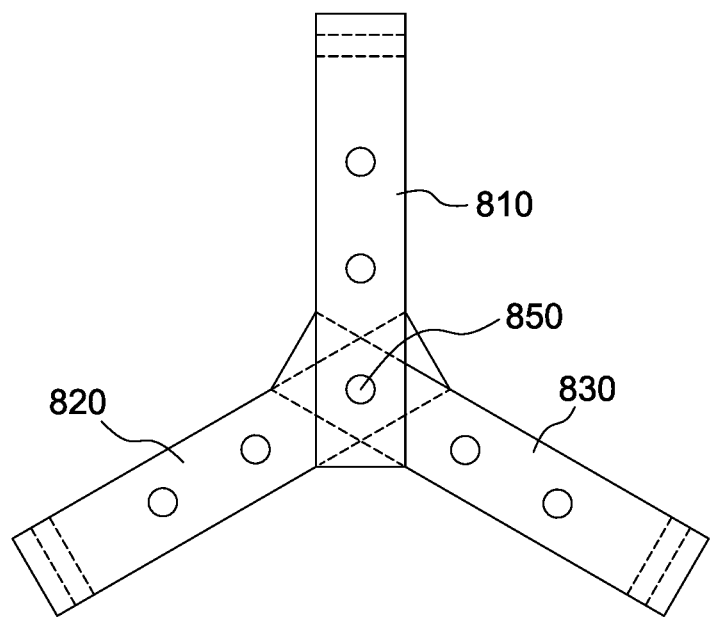
FIG. 8 is a schematic diagram illustrating a top view of a combination of hook members in accordance with some embodiments of the present disclosure.

In some embodiments, a device for attaching a semiconductor device to a circuit board may include a combination of more than two hook members, each of which includes a single hook. FIG. 8 is a schematic diagram illustrating a top view of a combination of hook members in accordance with some embodiments of the present disclosure. In some embodiments, hook members 810, 820 and 830 may have substantially the same structure as the hook member 710. In some alternative embodiments, hook members 810, 820 and 830 may have structures that are different from each other. A plurality of holes are disposed on the body of the hook members 810, 820 and 830. As shown in FIG. 8, the hook members 810, 820 and 830 are stacked, with each having one of their holes 850 aligned. A holder may pass through the holes 850.

Figure 9A:
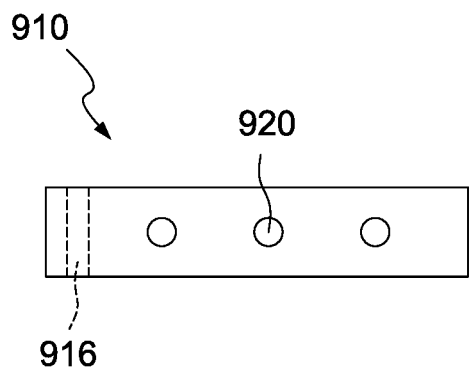
FIG. 9A is a schematic diagram illustrating a top view of a hook member in accordance with some embodiments of the present disclosure.
Figure 9B:
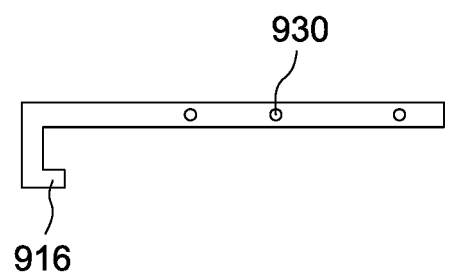
FIG. 9B is a schematic diagram illustrating a side view of a hook member in accordance with some embodiments of the present disclosure.

In some embodiments, a hook member may include one or more holes disposed on a lateral side of the hook member. FIG. 9A is a schematic diagram illustrating a top view of a hook member in accordance with some embodiments of the present disclosure. Hook member 910 has one hook 916 on one edge of the hook member 910. A plurality of holes 920 are disposed on the body of hook member 910 for a holder to pass through. FIG. 9B is a schematic diagram illustrating a side view of a hook member in accordance with some embodiments of the present disclosure. As shown in FIG. 9B, a plurality of holes 930 are disposed on a lateral side of the hook member 910 such that a bolt may pass through any one of the plurality of holes 930.

Figure 9C:
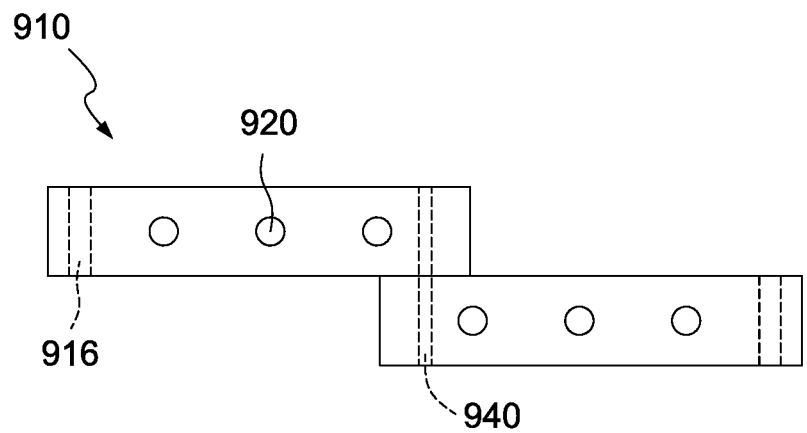
FIG. 9C is a schematic diagram illustrating a top view of a combination of hook members in accordance with some embodiments of the present disclosure.
Figure 9D:
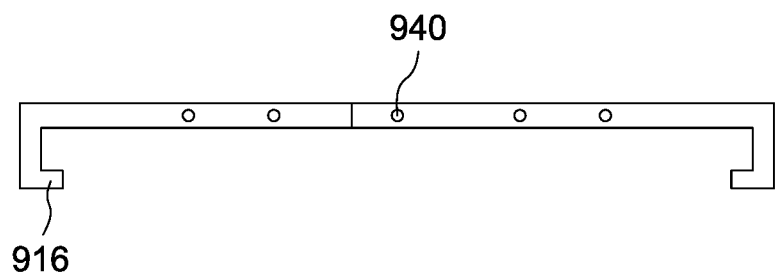
FIG. 9D is a schematic diagram illustrating a side view of a combination of hook members in accordance with some embodiments of the present disclosure.

In some embodiments, a device for attaching a semiconductor device to a circuit board may include a combination of multiple hook members, each of which includes one or more holes disposed on a lateral side of the hook member. FIG. 9C is a schematic diagram illustrating a top view of a combination of hook members in accordance with some embodiments of the present disclosure. FIG. 9D is a schematic diagram illustrating a side view of a combination of hook members in accordance with some embodiments of the present disclosure. As shown in FIGS. 9C and 9D, two hook members 910 may be laterally aligned at a hole 940 and connected by a bolt passing through the hole 940.

Figure 10A:
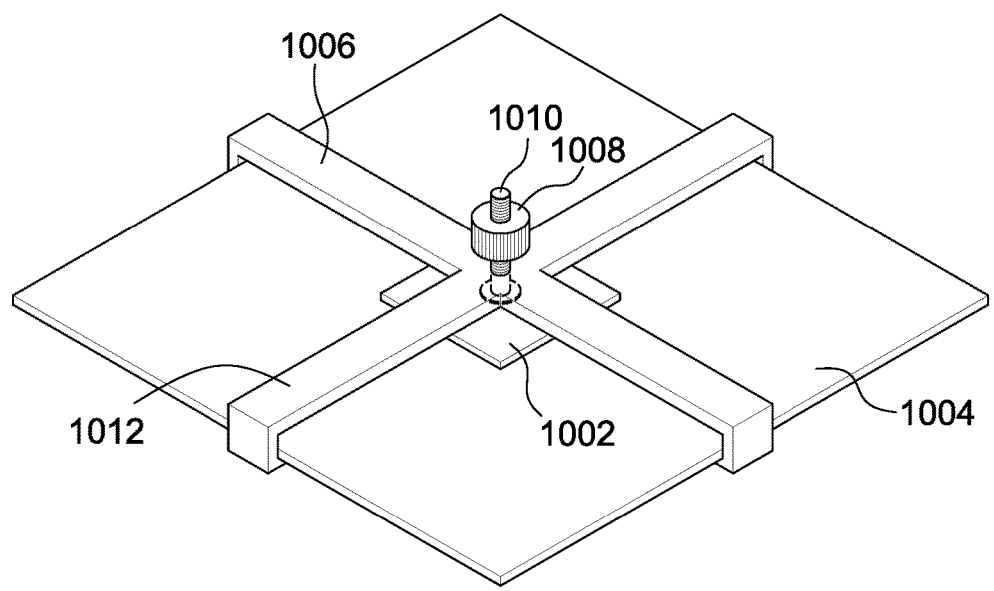
FIG. 10A is a schematic diagram illustrating an operation of a device for attaching a semiconductor device to a circuit board in accordance with some embodiments of the present disclosure.

In some embodiments, prior to testing of a semiconductor device, a device with one or more hook members (e.g., devices shown in FIGS. 2, 3A, 3B, 4, 5A, 5B, 5C, 5D, 6A, 6B, 6C, 7A, 7B, 7C, 8, 9A, 9B, 9C and 9D) is used to attach a semiconductor device to a circuit board. FIG. 10A is a schematic diagram illustrating an operation of a device for attaching a semiconductor device to a circuit board in accordance with some embodiments of the present disclosure. Hook member 1006 includes hooks that are fixed at edges of a circuit board 1004. A bolt section of a holder 1010 passes through a hole disposed on the body of the hook member 1006 and engages with a fixing member 1008. An abutting section 1012 of the holder 1010 is in contact with a top surface of a semiconductor device 1002 and applies a pressure to the semiconductor device 1002.

The hook member 1006, the fixing member 1008, and the holder 1010 are collectively referred to as attaching device. The attaching device uses mechanical forces to attach the semiconductor device 1002 to the circuit board 1004. As a result, the semiconductor device 1002 is electrically connected to the circuit board 1004 during a testing process (e.g., electro-migration testing or thermal cycle testing). There is no need of permanently disposing the semiconductor device 1002 to the circuit board 1004 through processes such as the stencil fabrication process and the SMT process. After the testing process, the attaching device may release the mechanical forces by, e.g., twisting the fixing member 1008. Then the attaching device may be removed and the semiconductor device 1002 may be detached from the circuit board 1004.

During electro-migration testing and thermal cycle testing procedures, one or more semiconductor devices are placed into an oven that maintains a temperature of at least about 120° C., at least about 165° C., at least about 200° C., or at least about 250° C. Such a high temperature causes warpage of the circuit boards to which the semiconductor devices are attached, without the device in accordance with the present disclosure. The device in accordance with the present disclosure prevents or minimizes the warpage of the circuit boards.

Figure 10B:
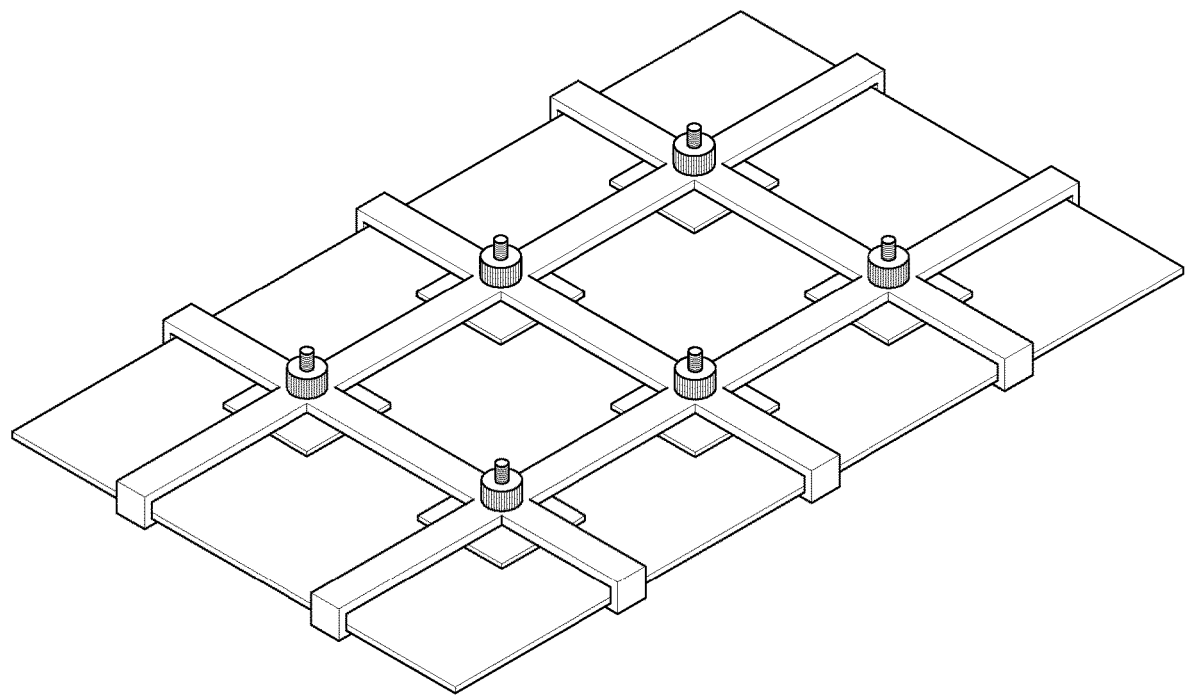
FIG. 10B is a schematic diagram illustrating an operation of a device for attaching one or more semiconductor devices to a circuit board in accordance with some embodiments of the present disclosure.

FIG. 10B is a schematic diagram illustrating an operation of a device for attaching one or more semiconductor devices to a circuit board in accordance with some embodiments of the present disclosure. As shown in FIG. 10B, multiple semiconductor devices can be attached to a circuit board simultaneously using a combination of multiple hook members, fixing members and holders.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A device for attaching a semiconductor device to a circuit board, comprising:
    a first hook member including a first hook, a second hook and a first body between the first hook and the second hook, the first body having a first surface, a second surface opposite the first surface, and a first hole and a second hole extended from the first surface to the second surface;
    a second hook member including a first hook, a second hook and a second body between the first hook of the second hook member and the second hook of second hook member, the second body having a first surface, a second surface opposite the first surface, and a third hole and a fourth hole extended from the first surface to the second surface of the second body; and
    a holder configured to pass through the first hole and the third hole and configured to abut the semiconductor device, wherein a length of the first hook of the first hook member is different from a length of the first hook of the second hook member.

2. The device of claim 1, wherein the holder includes a bolt section and an abutting section.

3. The device of claim 1, wherein the first hook member, the second hook member and the holder include a material having a melting point that is at least approximately 165° C.

4. The device of claim 1, wherein the first body further includes a fifth hole extended from the first surface to the second surface, wherein a distance between the fifth hole and the first hook of the first hook member is smaller than a distance between the fifth hole and the second hook of the first hook member.

5. The device of claim 1, wherein the third hole of the second body is aligned with the first hole of the first body in a direction perpendicular to the first surface of the first body.

6. The device of claim 1, wherein the second surface of the first body is in contact with the first surface of the second body.

7. The device of claim 1, wherein a distance between the first hole and the first hook of the first hook member is greater than a distance between the first hole and the second hook of the first hook member.

8. The device of claim 1, wherein a distance between the third hole and the first hook of the second hook member is greater than a distance between the third hole and the second hook of the second hook member.

9. The device of claim 1, wherein a distance between the second hole and the first hook of the first hook member is equal to a distance between the second hole and the second hook of the first hook member.

10. The device of claim 1, wherein a distance between the fourth hole and the first hook of the second hook member is equal to a distance between the fourth hole and the second hook of the second hook member.

11. The device of claim 1, wherein the holder is configured to pass through the first hole and the fourth hole.

12. The device of claim 1, wherein the holder is configured to pass through the second hole and the third hole.

13. A device for attaching a semiconductor device to a circuit board, comprising:
    a first hook member including a first hook and a first body connected to the first hook, the first body having a first surface, a second surface opposite the first surface, and a first hole and a second hole extended from the first surface to the second surface;
    a second hook member including a first hook and a second body connected to the first hook of the second hook member, the second body having a first surface, a second surface opposite the first surface, and a third hole and a fourth hole extended from the first surface to the second surface of the second body; and
    a holder configured to pass through the first hole and the third hole and configured to abut the semiconductor device, wherein a length of the first hook of the first hook member is different from a length of the first hook of the second hook member.

14. The device of claim 13, wherein the first hook member further includes a second hook connected to the first body of the first hook member.

15. The device of claim 13, wherein the holder includes a bolt section and an abutting section.

16. The device of claim 13, wherein the third hole of the second body is aligned with the first hole of the first body in a direction perpendicular to the first surface of the first body.

17. The device of claim 13, wherein the second hook member further includes a second hook connected to the second body of the second hook member.

18. The device of claim 13, wherein the first body further includes a fifth hole extended from the first surface to the second surface, wherein a distance between the fifth hole and the first hook of the first hook member is smaller than a distance between the second hole and the first hook of the first hook member.

19. The device of claim 13, wherein a distance between the first hole and the first hook of the first hook member is greater than a distance between the second hole and the first hook of the first hook member.

20. The device of claim 19, wherein a distance between the fourth hole and the first hook of the second hook member is equal to a distance between the fourth hole and the second hook of the second hook member.

21. The device of claim 19, wherein the holder is configured to pass through the fifth hole and the third hole.

* * * * *